(12) United States Patent
Gong et al.

(10) Patent No.: US 8,450,152 B2
(45) Date of Patent: May 28, 2013

(54) DOUBLE-SIDE EXPOSED SEMICONDUCTOR DEVICE AND ITS MANUFACTURING METHOD

(75) Inventors: Yuping Gong, Songjiang (CN); Yan Xun Xue, Los Gatos, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 150 days.

(21) Appl. No.: 13/193,474

(22) Filed: Jul. 28, 2011

(65) Prior Publication Data

US 2013/0026615 A1 Jan. 31, 2013

(51) Int. Cl.
 *H01L 21/00* (2006.01)
(52) U.S. Cl.
 USPC .... 438/113; 438/111; 438/458; 257/E21.122; 257/671; 257/675
(58) Field of Classification Search
 CPC .............................. H01L 21/60; H01L 23/495
 USPC ................. 438/111, 113, 114, 118, 126, 458, 438/459, 464, 465; 257/E21.122, E21.508, 257/E23.044, 578, 621, 675, 659, 671, 677, 257/686, 706, 707
 See application file for complete search history.

(56) References Cited

U.S. PATENT DOCUMENTS

| | | | | |
|---|---|---|---|---|
| 7,429,499 B2 * | 9/2008 | Yang | ............................. | 438/110 |
| 7,786,565 B2 * | 8/2010 | Kitabatake et al. | ............ | 257/689 |
| 8,058,732 B2 * | 11/2011 | Gruenhagen et al. | ......... | 257/774 |
| 8,178,972 B2 * | 5/2012 | Yutani | ............................ | 257/738 |
| 2003/0059979 A1 * | 3/2003 | Ukita et al. | .................... | 438/113 |
| 2004/0089934 A1 * | 5/2004 | Shimoida et al. | ............. | 257/686 |
| 2005/0029646 A1 * | 2/2005 | Ueda et al. | ..................... | 257/687 |
| 2005/0263859 A1 * | 12/2005 | Kime et al. | ..................... | 257/659 |
| 2006/0131745 A1 * | 6/2006 | Yutani | ............................ | 257/737 |
| 2007/0108564 A1 * | 5/2007 | Tang et al. | .................... | 257/675 |
| 2007/0215980 A1 * | 9/2007 | Otremba | ....................... | 257/578 |
| 2008/0191359 A1 * | 8/2008 | Koller et al. | ................... | 257/773 |
| 2008/0242052 A1 * | 10/2008 | Feng et al. | .................... | 438/459 |
| 2010/0264523 A1 * | 10/2010 | Koller et al. | .................. | 257/659 |
| 2011/0189835 A1 * | 8/2011 | Sugo et al. | .................... | 438/464 |
| 2012/0129299 A1 * | 5/2012 | Lin et al. | ....................... | 438/118 |
| 2012/0286293 A1 * | 11/2012 | Otremba et al. | ................ | 257/77 |
| 2012/0289001 A1 * | 11/2012 | Hebert et al. | ................. | 438/113 |
| 2013/0037917 A1 * | 2/2013 | Xue | ............................. | 257/621 |

* cited by examiner

*Primary Examiner* — Chris Chu
(74) *Attorney, Agent, or Firm* — Chein-Hwa Tsao; Chemily LLC

(57) ABSTRACT

A double-side exposed semiconductor device includes an electric conductive first lead frame attached on top of a thermal conductive but electrical nonconductive second lead frame and a semiconductor chip flipped and attached on top of the first lead frame. The gate and source electrodes on top of the flipped chip form electrical connections with gate and source pins of the first lead frame respectively. The flipped chip and center portions of the first and second lead frames are then encapsulated with a molding compound, such that the heat sink formed at the center of the second lead frame and the drain electrode at bottom of the semiconductor chip are exposed on two opposite sides of the semiconductor device. Thus, heat dissipation performance of the semiconductor device is effectively improved without increasing the size of the semiconductor device.

15 Claims, 9 Drawing Sheets

DOUBLE-SIDE EXPOSED SEMICONDUCTOR DEVICE AND ITS MANUFACTURING METHOD

TECHNICAL FIELD

This invention relates to a semiconductor device and its manufacturing methods, specifically relates to a double-side exposed semiconductor device for improvement of the thermal dissipation performance.

BACKGROUND TECHNOLOGY

In applications of semiconductor power devices, the device's size and heat dissipation are two important parameters. To improve thermal performance, thinner semiconductor wafer is used and large area is exposed out of the package without increasing the size of the devices. Conventional semiconductor devices use the exposure of source or drain to improve heat dissipation.

FIG. 1 and FIG. 2 are cross-sectional and perspective views of an existing semiconductor device, in which the gate 110 and source 120 of a semiconductor chip 100 are located at the top of the semiconductor chip 100 and connect to pins 151, 152 respectively through solder balls 140. The drain 130 located at the bottom of the semiconductor chip 100 is directly exposed from the molding compound 160. The exposed area of the drain 130 can be the whole bottom surface of molding compound 160, as shown in FIG. 2, or can be a part of bottom surface of molding compound 160, as shown in FIG. 1. In this device, only the surface of drain 130 is exposed for heat dissipation.

FIG. 3 is a cross-sectional schematic view of another existing semiconductor device. In this device, drain 130 of a flipped chip 100 is connected to a heat sink 170 that is exposed from the top surface of the molding compound 160. The gate and source of flipped chip 100 are connected correspondingly to pins 191, 192 through solder balls 140. The bottom of pins 191, 192 is exposed from the molding compound 160, which improves the thermal performance.

However, the process of manufacturing of the existing devices is very complicated.

SUMMARY OF THE INVENTION

A double-side exposed semiconductor device includes a bottom electrode of a semiconductor chip and a heat sink of a lead frame expose on two opposite sides of the device for improvement of the heat dissipation performance.

An electrical conductive first lead frame, which includes a plurality of pins, is attached on a top surface of a thermal conductive and electrical non-conductive second lead frame that includes a heat sink. The bottom surface of the second lead frame is coated with Ni or Cu.

A semiconductor chip including top electrodes and bottom electrodes is flipped and attached on top of the first lead frame. As such, top electrodes of the semiconductor chip are facing downward and electrically connecting to corresponding pins of the first lead frame.

A molding compound is deposited to encapsulate the flipped chip and the center portions of the first and second lead frames such that the heat sink of the second lead frame and bottom electrode of the semiconductor chip are exposed on two opposite sides of the semiconductor device.

The first lead frame can be made from copper (Cu) or other electrical conductive materials. The second lead frame is made from alumina ($Al_2O_3$) or aluminum nitride (AlN) or other thermal conductive but electrical nonconductive materials. The first lead frame is connected to the second lead frame using welding or epoxy bonding techniques.

In one embodiment, the bottom electrode of the semiconductor chip includes drain electrode and the top electrodes include gate and source electrodes. As such, the pins of the first lead frame include gate pins and source pins. The heat sink of the second lead frame is positioned beneath the connected positions of the gate electrode and the gate pin and the source electrode with the source pins.

In one embodiment, the semiconductor chips, each of which includes bottom drain electrode and top gate and top source electrodes, are formed in a semiconductor wafer. Solder balls are formed on the gate and source electrodes and then are connected correspondingly to the gate pins and source pins of the first lead frame. The wafer is ground on its back surface to a predetermined thickness. The individual semiconductor chips are then singulated from the wafer. A conductive layer is then formed on the back surface of the thinned wafer, for example through the evaporation of Ti, Ag or Ni, which functions as the drain electrode and also a protective layer of the semiconductor chip.

In one embodiment, the semiconductor chip also contains a chip molding compound that covers the top surface of the wafer and the solder balls. Top portions of the chip molding compound and solder balls are then ground to expose the top surface of the solder ball with the top surface of the solder ball and top surface of the chip molding compound being co-planar. The individual semiconductor chips are then singulated from the wafer.

In one embodiment, the semiconductor chip also contains a chip molding compound that covers the top surface of the wafer and the solder balls with top portions of solder balls protruded from the chip molding compound. The individual semiconductor chips are then singulated from the wafer.

In the double-side expose semiconductor device, the part of gate pins and source pins of the first lead frame not covered by the molding compound are bended in a ladder shape with the ends of these pins being on a same plane with the exposed drain of the flipped chip.

DETAILED DESCRIPTION OF THE DRAWINGS

The specific embodiments of the double-side exposed semiconductor device and its manufacturing methods in the present invention will be illustrated with the attached drawings.

Figure 22:
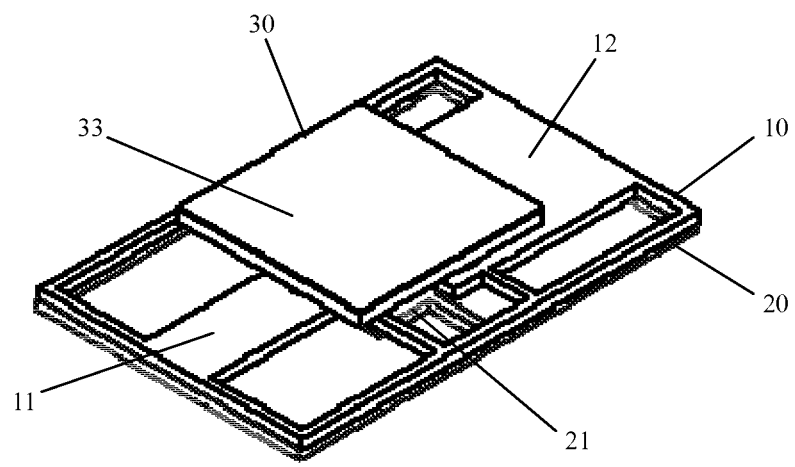
FIG. 22-25 are perspective schematic diagrams showing the steps of forming a double-side exposed semiconductor device of the present invention.
Figure 23:
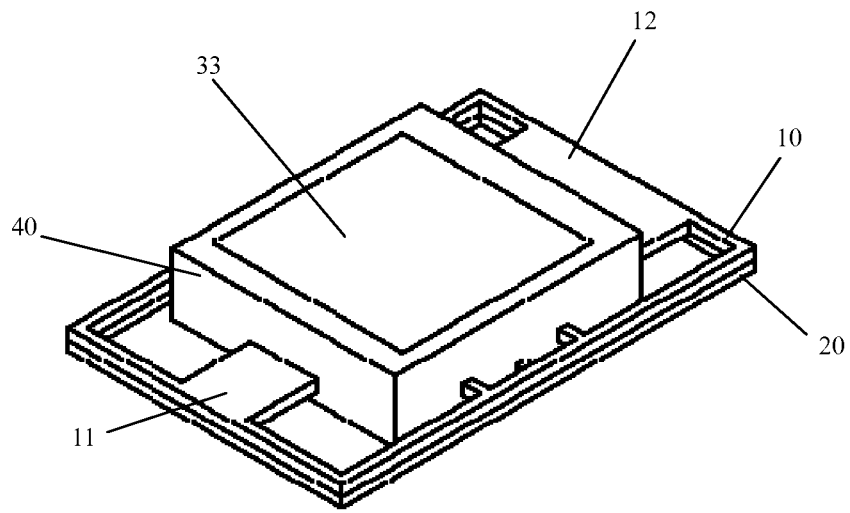
Figure 24:
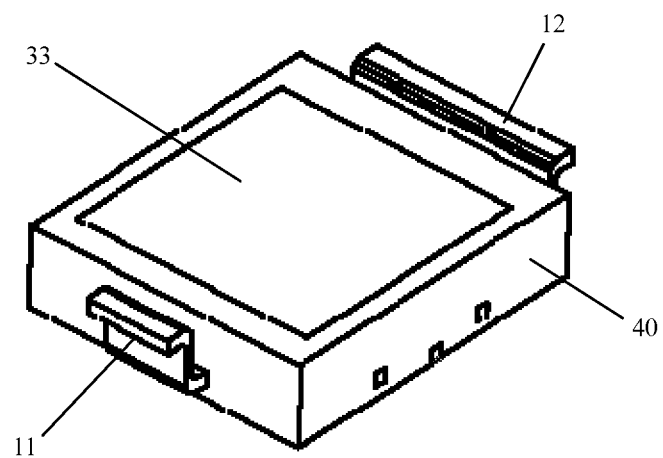
Figure 25:
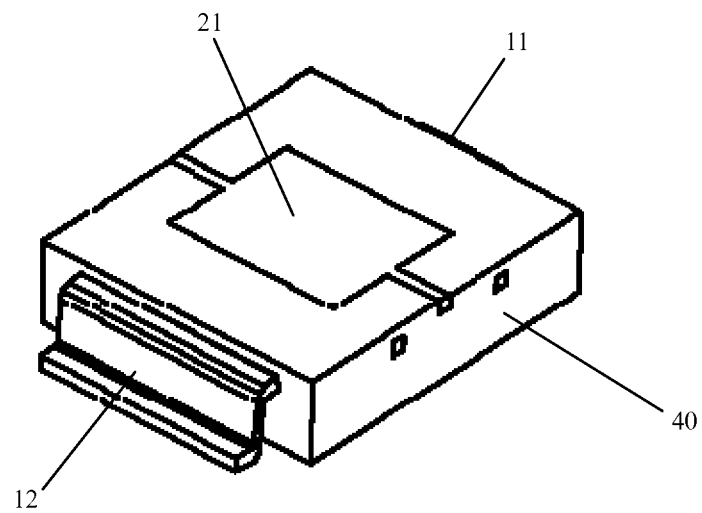

FIGS. 22-25 are perspective views showing the steps of forming a double-side exposed semiconductor device of the present invention. As shown in FIG. 22, a first lead frame 10 is attached on top of a second lead frame 20. A semiconductor chip 30 is flipped and attached on top of the first lead frame 10 with the bottom electrode 33, i.e., a drain electrode, of the semiconductor chip exposed at the top surface of the structure. As shown in FIG. 23, a molding compound 40 is deposited to encapsulate the flip chip 30 and covers center portions of the first and second lead frames 10, 20. As shown in FIG. 24, the excess parts at edges of the first and second lead frames are removed and the parts of the pins 11 and 12 that are not covered by the molding compound 40 are bended upward toward the drain 33. As shown in FIGS. 24 and 25, the heat sink 21 formed in the second lead frame 20 and the drain 33 at the bottom of the semiconductor chip 30 are exposed from the molding compound 40 on two opposite sides of the semiconductor device.

Figure 1:
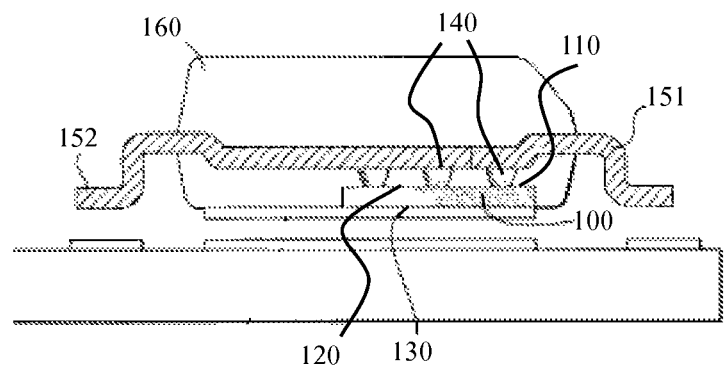
FIG. 1 and FIG. 2 are cross-sectional and perspective schematic diagrams of a conventional semiconductor device with the drain electrode of the semiconductor chip exposed at a bottom of the semiconductor device package.
Figure 2:
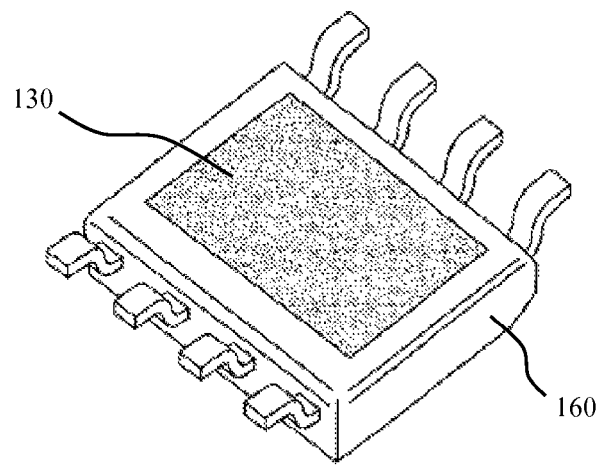
Figure 3:
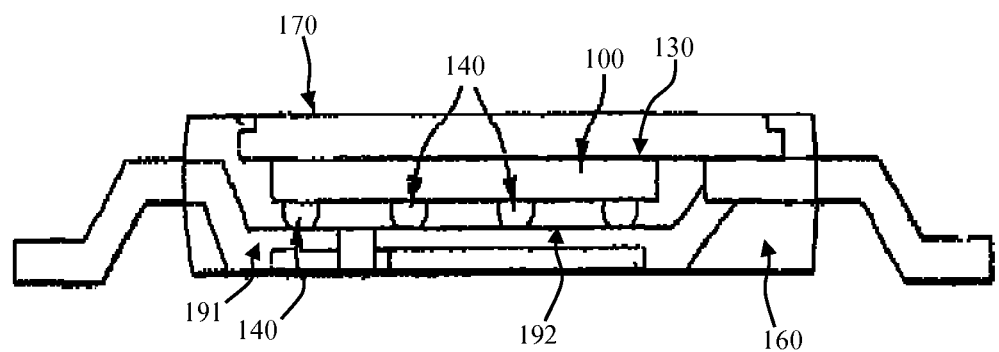
FIG. 3 is cross-sectional schematic diagram of another conventional semiconductor device with the drain of the semiconductor chip connected with a heat sink and exposed at the top surface of semiconductor device.
Figure 4:
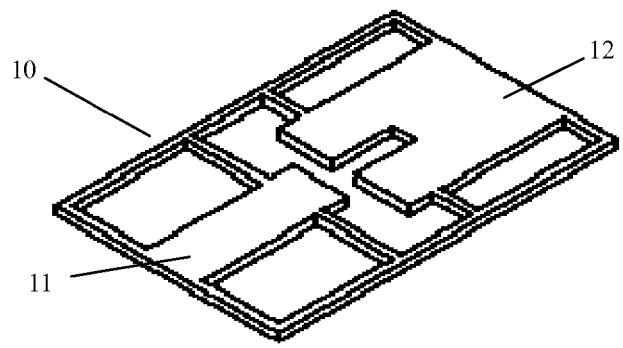
FIG. 4 is a perspective schematic diagram of a first lead frame.

FIG. 4 is a perspective view showing the first lead frame 10 including a gate pin 11 and a source pin 12. The first lead frame 10 can be made from copper or other electrical conductive materials.

Figure 5:
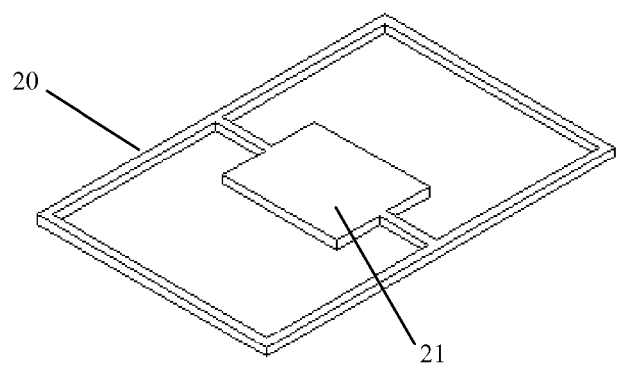
FIG. 5 is a perspective schematic diagram of a second lead frame.

FIG. 5 is a perspective view showing the second lead frame 20 including a heat sink 21 formed at the center of the second lead frame 20. The lead frame 20 can be made from aluminum oxide ($Al_2O_3$), aluminum nitride (AlN) or other heat conductive but electrical nonconductive materials with Nickel (Ni), or copper (Cu) coating only on back surface of the second lead frame 20.

Figure 6:
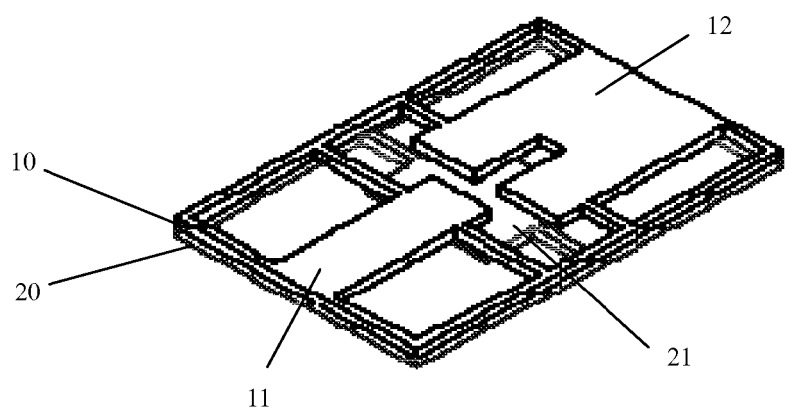
FIG. 6 is a perspective schematic diagram of a connection structure of first and second lead frames.

As shown in FIG. 6, the first lead frame 10 is attached on top of the second lead frame 20 using welding or epoxy bonding method, such that portions of gate pin 11 and source pin 12 at the center of the first lead frame 10 are vertically aligned with the heat sink 21 at the center of the second lead frame 20. The top surface of the second lead frame 20 that is physically connected to the first lead frame 10 is not coated with Nickel or Copper to prevent short circuit.

The semiconductor chip 30 used in the double-side exposed semiconductor device package described in FIGS. 22-25 can be one of the three different structures as described below.

Figure 7:
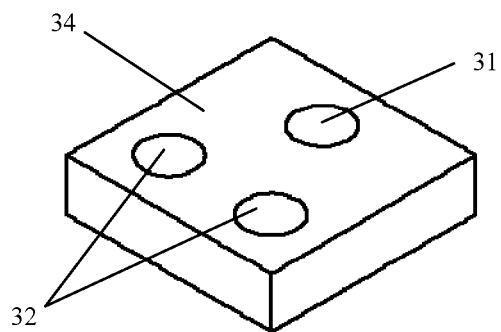
FIG. 7 to FIG. 10 are perspective schematic diagrams illustrating the steps of forming a first structure of the semiconductor chip used in a double-side exposed semiconductor device of the present invention.
Figure 8:
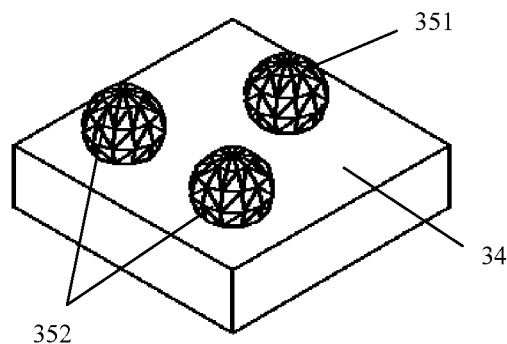
Figure 9:
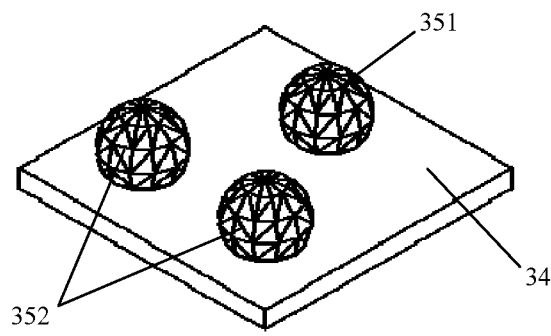
Figure 10:
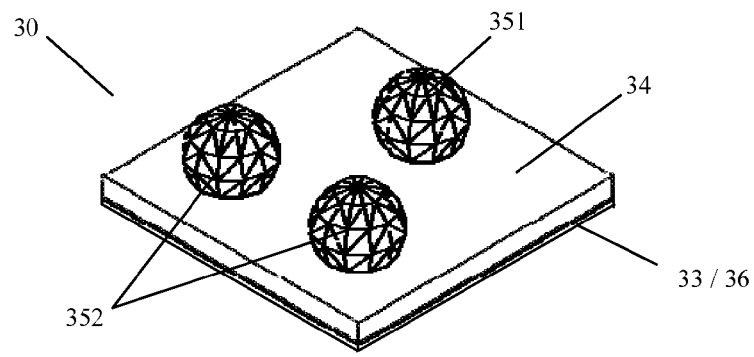

FIGS. 7-10 are perspective views showing the steps of making a first structure of the semiconductor chip 30. Referring to FIG. 7, semiconductor chips are formed on a top surface of a semiconductor wafer 34, each of which includes source 32 and gate 31 at the top of the semiconductor chip and a drain 33 at the bottom of the semiconductor chip. Solder balls 351 and 352 are formed at gate 31 and source 32 of semiconductor chip 30 on top surface of the wafer 34, as shown in FIG. 8. The wafer 34 is ground at its back surface to a predetermined thickness as shown in FIG. 9. A conductive layer 36 is deposited on the back surface of thinned wafer 34, for example by evaporation of Ti, Ag or Ni materials at the back surface of the thinned wafer during the metallization process, which is electrically connected to the drain 33 at the bottom of the semiconductor chip and also functions a protective layer of the semiconductor chip 30 as shown in FIG. 10. Finally, the wafer 34 is cut to separate semiconductor chips 30 (not shown).

Figure 11:
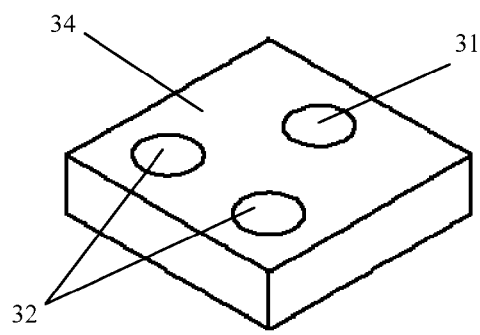
FIG. 11 to FIG. 16 are perspective schematic diagrams illustrating the steps of forming a second structure of the semiconductor chip used in a double-side exposed semiconductor device of the present invention.
Figure 12:
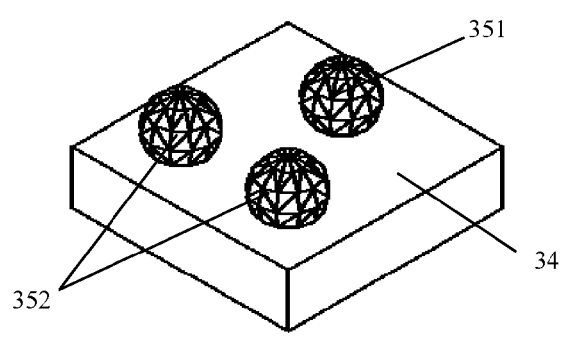
Figure 13:
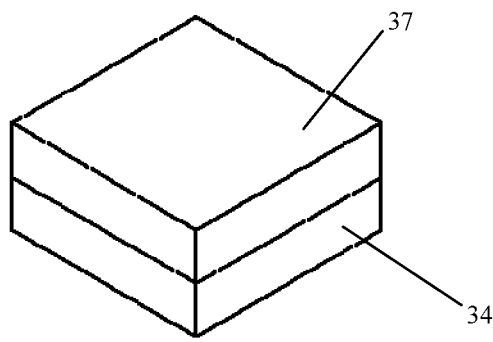
Figure 14:
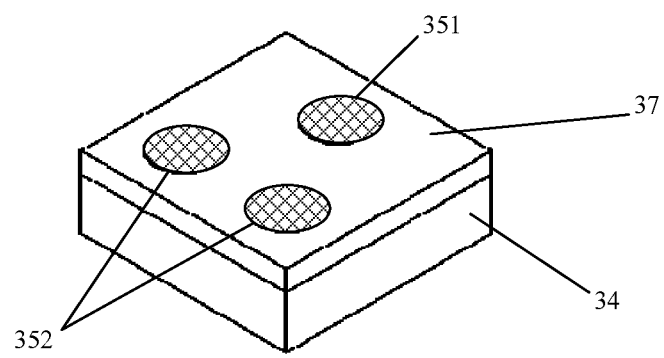
Figure 15:
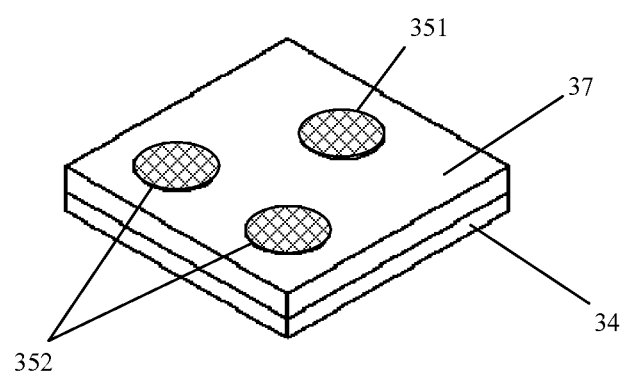
Figure 16:
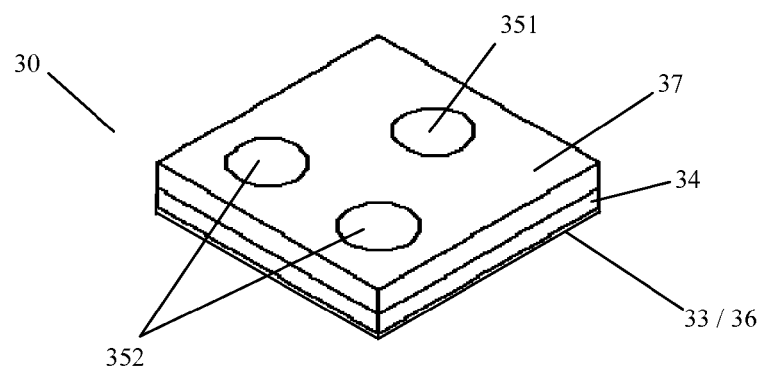

FIGS. 11-16 are perspective views illustrating the steps of making a fan-in structure of the semiconductor chip 30. FIG. 11 and FIG. 12 are equivalent to FIG. 7 and FIG. 8, in which solder balls 351 and 352 are formed on top surface of semiconductor wafer 34 at gate 31 and source 32 respectively of semiconductor chip 30. A molding compound 37 is deposited to cover the top surface of wafer 34 and the solder balls 351, 352, as shown in FIG. 13. The molding compound 37 is then ground to expose the solder balls 351, 352 with the exposed portions of the solder balls 351, 352 are also ground away, so that the top surface of solder balls 351, 352 and the top surface of thinned molding compound 37 are co-planar, as shown in FIG. 14. The wafer 34 is then ground at its back surface to reduce its thickness, as shown in FIG. 15. A conductive layer 36 is deposited on the back surface of thinned wafer 34, for example by evaporation of Ti, Ag or Ni materials at the back surface of the thinned wafer during the metallization process, which functions as a drain electrode and also a protective layer of the semiconductor chip 30, as shown in FIG. 16. Finally, the wafer 34 is cut to separate semiconductor chips 30 (not shown).

Figure 17:
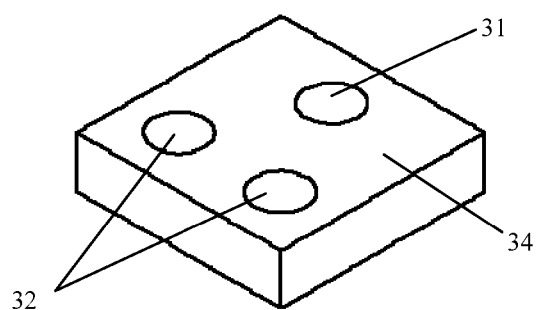
FIG. 17 to FIG. 21 are perspective schematic diagrams illustrating the steps of forming a third structure of the semiconductor chip used in a double-side exposed semiconductor device of the present invention.
Figure 18:
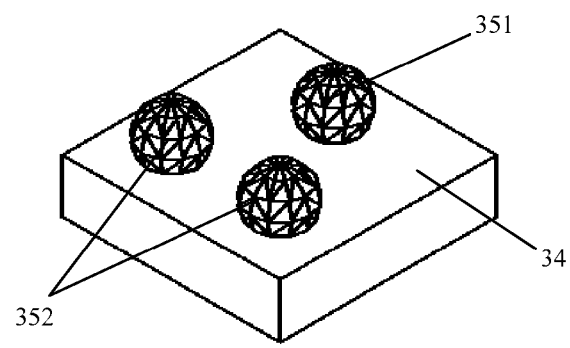
Figure 19:
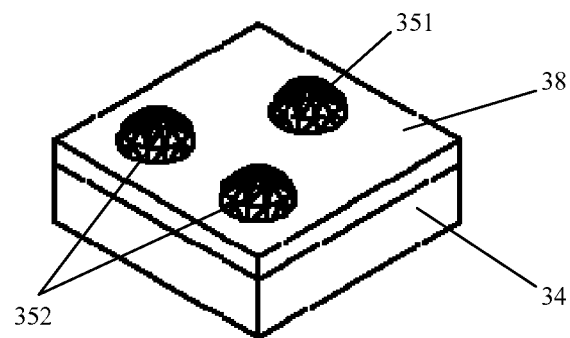
Figure 20:
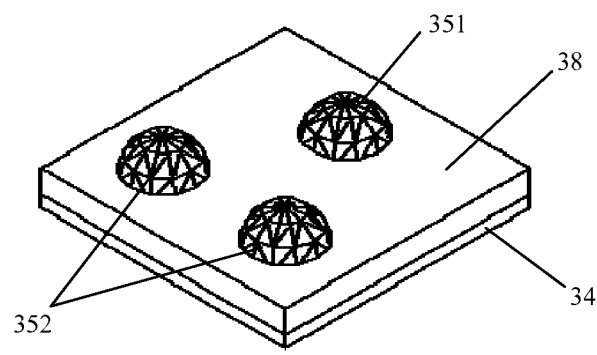
Figure 21:
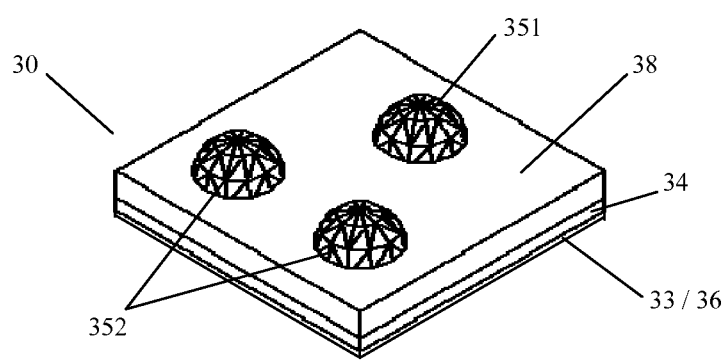

FIGS. 17-21 are perspective views illustrating the steps of making a fan-out structure of the semiconductor chip 30. FIG. 17 and FIG. 18 are equivalent to FIG. 7 and FIG. 8, in which solder balls 351 and 352 are formed on top surface of semiconductor wafer 34 at gate 31 and source 32 respectively of semiconductor chip 30. A molding compound 38 is deposited to cover the top surface of wafer 34 but not cover the whole solder balls 351, 352, i.e., the top portions of the solder balls 351, 352 are protruded from the molding compound 38 as shown in FIG. 19. The wafer 34 is then ground at its back surface to reduce its thickness, as shown in FIG. 20. A conductive layer 36 is deposited on the back surface of thinned wafer 34, for example by evaporation of Ti, Ag or Ni materials at the back surface of the thinned wafer during the metallization process, which functions as the drain electrode and also a protective layer of the semiconductor chip 30 as shown in FIG. 21. Finally, the wafer 34 is cut to separate semiconductor chips 30 (not shown).

As shown in FIG. 22, semiconductor chip 30 of any structure type depicted above in FIGS. 10, 16 and 21 is flipped and electrically connected to the first lead frame 10. The solder balls 351 and 352 formed at the gate 31 and source 32 of the flip-chip 30 are electrically connected to the gate pin 11 and the source pin 12 respectively on the first lead frame 10. Drain 33 of the flip chip 30 is then exposed from the top surface of molding compound 40 (as shown in FIG. 23 and FIG. 24).

As described above, as shown in FIG. 25, the back surface of the heat sink 21 of second lead frame 20 is exposed from the bottom surface of molding compound 40. The heat sink 21 is used to improve the heat dissipation of junctions between gate 31 of semiconductor chip 30 with gate pin 11 and between source 32 of semiconductor chip 30 with source pin 12. As shown in FIG. 24 and FIG. 25, the portions of the gate pin 11 and source pin 12 that are exposed outside of the molding compound 40 are bended in a ladder shape with the end of pins 11 and 12 being in the same plane with the exposed drain 33, so that the semiconductor device package can be connected with the external printed circuit board or other electronic devices through the gate pin 11, source pin 12 and directly to exposed drain 33.

The double-side exposed semiconductor device of the present invention includes the heat sink 21 and the drain 33 of the semiconductor chip 30 exposing from the molding compound, thus the heat dissipation performance of the semiconductor device can be improved effectively without increasing the size of the device.

Although the contents of this invention have been described in detail in the above said preferred embodiments, it should be recognized that the above description shall not be considered as a limitation for this invention. After reading the above description by technical personnel in this field, a number of modifications and replacements for this invention will be obvious. Therefore, the scope of protection for this invention shall be in accordance with the attached claims.

The invention claimed is:

1. A manufacturing method of a double-side exposed semiconductor device, comprising:
    attaching an electrical conductive first lead frame on a top surface of a thermal conductive and electrical nonconductive second lead frame that includes a heat sink;
    forming a plurality of semiconductor chips at a top surface of a semiconductor wafer, each of semiconductor chip comprising top electrodes and a bottom electrode;
    singulating the individual semiconductor chips from the semiconductor wafer;
    flipping a semiconductor chip and connecting it to the first lead frame; and
    encapsulating the semiconductor chip and center portions of the first and second lead frames with a molding compound
    wherein the heat sink of second lead frame and the bottom electrode of the semiconductor chip expose from the molding compound on two opposite sides of the semiconductor device.

2. The manufacturing method of a double-side exposed semiconductor device of claim 1, wherein the first lead frame consists of copper or other electrical conductive material and includes a gate pin and a source pin, and wherein the second lead frame consists of aluminum oxide (Al$_2$O$_3$), aluminum nitride (AlN), or other thermal conductive and electrical nonconductive material, with Ni or Cu coating only on a back surface of the heat sink of the second lead frame.

3. The manufacturing method of a double-side exposed semiconductor device of claim 2, wherein the first lead frame is attached on the top surface of the second lead frame using welding or epoxy resin technique, wherein the gate pin and the source pin of the first lead frame are positioned on top of the heat sink of second lead frame.

4. The manufacturing method of a double-side exposed semiconductor device claim 3, wherein the top electrodes of the semiconductor chip include gate and source electrodes and the bottom electrode includes a drain electrode.

5. The manufacturing method of a double-side exposed semiconductor device of claim 4, wherein forming a plurality of semiconductor chips at a top surface of a semiconductor wafer comprises:
    forming a plurality of semiconductor chips on a semiconductor wafer, each of the semiconductor chip comprises gate and source electrodes at the top of the semiconductor chip and a drain electrode at the bottom of the semiconductor chip;
    forming solder balls on the gate and source electrodes;
    grinding a back surface of the semiconductor wafer to a predetermined thickness; and
    forming a conductive layer on the back surface of the semiconductor wafer.

6. The manufacturing method of a double-side exposed semiconductor device of claim 5, wherein the conductive layer is formed by evaporation of Ti, Ag or Ni materials on the back surface of the semiconductor wafer, wherein the conductive layer functions as the drain electrode and a protective layer of the semiconductor chip.

7. The manufacturing method of a double-side exposed semiconductor device of claim 5, wherein the solder balls are electrically connected to the gate pin and the source pin on the first lead frame.

8. The manufacturing method of a double-side exposed semiconductor device of claim 5, wherein forming a plurality of semiconductor chips at a top surface of a semiconductor wafer comprises:
    forming a plurality of semiconductor chips on a semiconductor wafer, each of the semiconductor chip comprises gate and source electrodes at the top of the semiconductor chip and a drain electrode at the bottom of the semiconductor chip;
    forming solder balls on the gate and source electrodes;
    encapsulating a top surface of the semiconductor wafer and the solder balls with a chip molding compound;
    grinding the chip molding compound and top portions of the solder balls to expose the solder balls from the chip molding package, wherein top surface of the exposed solder balls and a top surface of the chip molding compound are co-planar;
    grinding a back surface of the semiconductor wafer to a predetermined thickness; and
    forming a conductive layer on the back surface of the semiconductor wafer.

9. The manufacturing method of a double-side exposed semiconductor device of claim 8, wherein the conductive layer is formed by evaporation of Ti, Ag or Ni materials on the back surface of the semiconductor wafer, wherein the conductive layer electrical functions as the drain electrode and a protective layer of the semiconductor chip.

10. The manufacturing method of a double-side exposed semiconductor device of claim 8, wherein the solder balls are electrically connected to the gate pin and the source pin on the first lead frame.

11. The manufacturing method of a double-side exposed semiconductor device of claim 5, wherein forming a plurality of semiconductor chips at a top surface of a semiconductor wafer comprises:
    forming a plurality of semiconductor chips on a semiconductor wafer, each of the semiconductor chip comprises gate and source electrodes at the top of the semiconductor chip and a drain electrode at the bottom of the semiconductor chip;
    forming solder balls on the gate and source electrodes;
    encapsulating a top surface of the semiconductor wafer and the solder balls with a chip molding compound, wherein top portions of the solder balls are protruded from the chip molding compound;
    grinding a back surface of the semiconductor wafer to a predetermined thickness; and
    forming a conductive layer on the back surface of the semiconductor wafer.

12. The manufacturing method of a double-side exposed semiconductor device of claim 11, wherein the conductive layer is formed by evaporation of Ti, Ag or Ni materials on the back surface of the semiconductor wafer, wherein the conductive layer electrical functions as the drain electrode and a protective layer of the semiconductor chip.

13. The manufacturing method of a double-side exposed semiconductor device of claim 11, wherein the solder balls are electrically connected to the gate pin and the source pin on the first lead frame.

14. The manufacturing method of a double-side exposed semiconductor device of claim 4, wherein a bottom surface of the heat sink of second lead frame and the drain electrode of the semiconductor chip expose on two opposite sides of the semiconductor device.

15. The manufacturing method of a double-side exposed semiconductor device of claim 4, further comprising:
removing excess parts at edges of the first and second lead frames and bend portions of gate pin and source pin that are not covered from the molding compound into a ladder shape, wherein ends of the gate and source pins are in the same plane with the exposed drain electrode of the semiconductor chip.

* * * * *